United States Patent [19]

Tachikawa et al.

[11] Patent Number: 5,200,389
[45] Date of Patent: Apr. 6, 1993

[54] METHOD FOR MANUFACTURING AN OXIDE SUPERCONDUCTING ARTICLE

[75] Inventors: Kyoji Tachikawa, Hiratsuka; Yukio Shinbo, Tokyo; Moriaki Ono, Tokyo; Shigeyoshi Kosuge, Tokyo; Makoto Kabasawa, Tokyo, all of Japan

[73] Assignees: The Tokai University Juridicial Foundation; NKK Corporation, both of Tokyo, Japan

[21] Appl. No.: 782,795

[22] Filed: Oct. 25, 1991

Related U.S. Application Data

[63] Continuation of Ser. No. 482,203, Feb. 20, 1990, abandoned.

[30] Foreign Application Priority Data

Mar. 13, 1989 [JP] Japan ............... 1-60460

[51] Int. Cl.$^5$ .............................. B05D 3/02
[52] U.S. Cl. ...................... 505/1; 505/733; 505/742; 427/62; 427/375; 427/419.2; 427/419.3; 427/376.1; 427/576
[58] Field of Search ............ 505/1, 733, 742, 725; 427/62, 63, 375, 376.1, 419.3, 419.2, 38

[56] References Cited

FOREIGN PATENT DOCUMENTS 0301656 2/1989 European Pat. Off. .
0319807 6/1989 European Pat. Off. .

OTHER PUBLICATIONS

Jin et al., "High critical currents in Y-Ba-Cu-O superconductors" Appl. Phys. lett. 52(24) Jun. 1988 pp. 2074-2076.
Severin et al., "Superconducting $YBa_2Cu_3O_x$ thin layers by solid state diffusion," Mat. Res. Bull. vol. 23 (1988) pp. 707-717.
Kumakura et al., "Ba-Y-Cu-O superconducting Tape Prepared by Surface diffusion Process", Jpn. J. Appl. Phys. 26(7) Jul. 1987 L1172-1173.
Tachikawa et al., "Preparation of B-Va-Cu oxide superconducting composite tapes by a diffusion process", MRS vol. 99 Nov. 1987 pp. 727-730.
Kyoji Tachikawa et al., "Fabrication of Superconducting Y-Ba-Cu Oxide Through an Improved Diffusion Process", Japanese Journal of Applied Physics, vol. 27, No. 8, Aug., 1988, pp. L1501-L1503.

*Primary Examiner*—Shrive Beck
*Assistant Examiner*—Roy V. King
*Attorney, Agent, or Firm*—Frishauf, Holtz, Goodman & Woodward

[57] ABSTRACT

A method for manufacturing a superconducting article, comprising the steps of: forming a first layer comprising a mixture of $LnBa_2Cu_3O_x$ and $Ln_2BaCuO_{x'}$ on the surface of a substrate, said Ln being an optional rare earth element; then forming a second layer comprising a mixture of at least CuO and $BaCuO_2$ on the surface of the first layer; and then melting the mixture in the second layer to cause the resultant melt of the mixture in the second layer to diffusion-react with $Ln_2BaCuO_{x'}$ in the first layer so as to convert the first and second layers into a film of a superconducting substance comprising $LnBa_2Cu_3O_x$; thereby manufacturing a superconducting article comprising the substrate and the film of the superconducting substance formed on the surface of the substrate.

11 Claims, 1 Drawing Sheet

METHOD FOR MANUFACTURING AN OXIDE SUPERCONDUCTING ARTICLE

This application is a continuation of application Ser. No. 07/482,203, filed Feb. 20, 1990 now abandoned.

REFERENCE TO PATENTS, APPLICATIONS AND PUBLICATIONS PERTINENT TO THE INVENTION

As far as we know, there is available the following prior art document pertinent to the present invention:
"Japanese Journal of Applied Physics", Vol. 27, No. 8, pages L1501–L1503, published on Jul. 22, 1988

The contents of the prior art disclosed in the above-mentioned prior art document will be discussed hereafter under the heading of the "BACKGROUND OF THE INVENTION".

FIELD OF THE INVENTION

The present invention relates to a method for manufacturing a superconducting article comprising a substrate and a film of a superconducting substance formed on the surface of the substrate.

BACKGROUND OF THE INVENTION

Superconducting materials have already been practically applied in the form of a superconducting magnet in a particle accelerator, a medical diagnosing instrument and the like. Potential applications of the superconducting materials include, an electric power generator, an energy storage device, a linear motor car, a magnetic separator, a nuclear fusion reactor, a power transmission cable, and a magnetic shielder. In addition, a superconducting element using the Josephson effect is expected to be applied in such fields as an ultra-high speed computer, an infrared sensor and a low-noise amplifier. The magnitude of the industrial and social impact which would be exerted the practical realization of these possible applications is really unmeasurable.

One of the typical superconducting materials so far developed is an Nb-Ti alloy which is widely used at present as a magnetizing wire. The Nb-Ti alloy has a critical temperature, i.e., a critical temperature from which a superconductive state occurs (hereinafter simply referred to as "Tc") of 9° K. As a superconducting material having a "Tc" considerably higher than that of the Nb-Ti alloy, a compound-type superconducting material has been developed, including an $Nb_3Sn$ (Tc: 18° K.) and $V_3Ga$ (Tc: 15° K.) which are now practically employed in the form of a wire.

As a superconducting material having a "Tc" further higher than those of the above-mentioned alloy-type and compound-type superconducting materials, a composite oxide superconducting material containing a $Cu_xO_y$-radical has recently been developed. For example, a Y-Ba-Cu-O type superconducting material has a "Tc" of about 93° K. Since liquid nitrogen has a temperature of 77° K., liquid nitrogen available at a lower cost than liquid helium can be used as a cooling medium for the composite oxide superconducting material. Discovery of a superconducting material having a high "Tc" applicable at a temperature of liquid nitrogen urges further expectations for the foregoing fields of application. In the actual application, however, problems are how to process a superconducting material in the form of a film or a wire, and at the same time, how to increase a critical current density (hereinafter simply referred to as "Jc") of the superconducting material.

In order to increase the "Jc" of a superconducting material, it is necessary, when using the superconducting material in the form of a film, to make the structure of the film dense with a single superconducting phase.

A method for manufacturing a superconducting article, in which "Jc" of a film of a superconducting material can be increased by making the structure of the film of the superconducting material dense with a single superconducting phase, is disclosed in the "Japanese Journal of Applied Physics", Vol. 27, No. 8, pages L1501–L1503, published on Jul. 22, 1988 (hereinafter referred to as the "prior art"). The prior art is described below with reference to the drawings.

FIG. 1 is a schematic descriptive view illustrating the former half steps of the method of the prior art for manufacturing a superconducting article, and FIG. 2 is a schematic descriptive view illustrating the latter half steps of the method of the prior art for manufacturing the superconducting article. First, a sheet-shaped substrate 1 comprising $Y_2BaCuO_{x'}$ is prepared. Then, a mixture of CuO and $BaCO_3$, in which the ratio of copper (Cu) to barium (Ba) is Cu:Ba=5:3 in molar ratio, is primary-fired at a temperature of 800° C. for 24 hours, cooled, and pulverized into a powder. The powder of the thus primary-fired mixture is then secondary-fired at a temperature of 900° C. for 24 hours, cooled, and pulverized into a powder to prepare a powdery material for a film. Subsequently, the thus prepared powdery material for a film is mixed with ethyl alcohol to prepare a slurry for a film.

Then, the thus prepared slurry for film is applied onto the surface of the substrate 1, and dried to form a film 2 comprising Ba-Cu oxides on the surface of the substrate 1, as shown in FIG. 1. Then, the substrate 1, on the surface of which the film 2 has thus been formed, is heated in an electric furnace to melt the film 2 to cause the resultant melt of the Ba-Cu oxides in the film 2 to diffusion-react with $Y_2BaCuO_{x'}$ in the substrate 1, thereby converting the film 2 into a film 3 of a superconducting substance comprising $YBa_2Cu_3O_x$, as shown in FIG. 2.

Then, the film 3 of the superconducting substance thus produced is cooled to a room temperature, thereby manufacturing a superconducting article comprising the non-reacting substrate 1 and the film 3 of the superconducting substance formed on the surface of the non-reacting substrate 1, as shown in FIG. 2.

The above-mentioned prior art has the following effects: Since the film 3 of the superconducting substance comprising $YBa_2Cu_3O_x$ is produced through the diffusion-reaction of the resultant melt of the Ba-Cu oxides in the film 2 with $Y_2BaCuO_{x'}$ in the substrate 1, the structure of the film 3 of the superconducting substance is dense with a single superconducting phase, thus permitting manufacture of a superconducting article having a high "Jc".

However, the above-mentioned prior art has the following problem: When the film 3 of the superconducting substance comprising $YBa_2Cu_3O_x$ is produced on the surface of the substrate 1 through the diffusion-reaction of the resultant melt of the Ba-Cu oxides in the film 2 with $Y_2BaCuO_{x'}$ in the substrate 1, the film 3 of the superconducting substance expands in volume, causing cracks in the film 3 of the superconducting substance and resulting in seriously deteriorated superconducting properties of the superconducting article including a largely decreased "Jc".

The above-mentioned problem occurs also in the case where the film 3 of a superconducting substance is produced by means of a compound containing an optional rare earth element other than "yttrium" (Y) in the above-mentioned $Y_2BaCuO_{x'}$ and $YBa_2Cu_3O_x$. Such an optional rare earth element is hereinafter represented by "Ln".

SUMMARY OF THE INVENTION

An object of the present invention is therefore to provide a method for manufacturing a superconducting article, which permits prevention, when producing a film of a superconducting substance comprising $LnBa_2Cu_3O_x$ on the surface of a substrate through the diffusion-reaction, of the occurrence of cracks in the film of the superconducting substance, and as a result allows the manufacture of a superconducting article having excellent superconducting properties.

In accordance with one of the features of the present invention, there is provided a method for manufacturing a superconducting article, characterized by comprising the steps of:

forming a first layer comprising a mixture of $Ln_2BaCuO_{x'}$ and $Ln_2BaCuO_x$ on the surface of a substrate, said Ln being an optional rare earth element, and the content ratio of $Ln_2BaCuO_{x'}$ in said first layer being within the range of from 5 to 80 wt. % relative to the total amount of $LnBa_2Cu_3O_x$ and $Ln_2BaCuO_{x'}$ then forming a second layer comprising a mixture of at least CuO and $BaCuO_2$ on the surface of said first layer, said second layer having a melting point within the range of from 800° to 1,000° C.; then melting said mixure in said second layer, and keeping the molten state of said second layer for a period of time of from 1 minute to 4 hours in an oxygen-containing atmosphere to cause the resultant melt of said mixture in said second layer to diffusion-react with $Ln_2BaCuO_{x'}$ in said first layer, thereby converting said first layer and said second layer into a film of a superconducting substance comprising $LnBa_2Cu_3O_x$; and cooling said film of said superconducting substance thus produced to a room temperature, thereby manufacturing a superconducting article comprising said substrate and said film of said superconducting substance formed on the surface of said substrate.

DETAILED DESCRIPTION OF PREFERRED EMBODIMENTS

From the above-mentioned point of view, extensive studies were carried out to develop a method for manufacturing a superconducting article, which permits prevention, when producing a film of a superconducting substance comprising $LnBa_2Cu_3O_x$ on the surface of a substrate through the diffusion-reaction, of the occurrence of cracks in the film of the superconducting substance, and as a result allows the manufacture of the superconducting article having excellent superconducting properties.

As a result, the following finding was obtained: Cracks occur in the film of the superconducting substance comprising $LnBa_2Cu_3O_x$ because the film of the superconducting substance expands in volume when the film of the superconducting substance comprising $LnBa_2Cu_3O_x$ is produced on the surface of the substrate through the diffusion reaction. Cracks can therefore be prevented from occurring in the film of the superconducting substance comprising $LnBa_2Cu_3O_x$, by reducing the amount of $LnBa_2Cu_3O_x$ produced through the diffusion reaction to reduce the amount of expansion in volume of the film of the superconducting substance comprising $LnBa_2Cu_3O_x$.

The present invention was developed on the basis of the above-mentioned finding. Now, an embodiment of the method of the present invention for manufacturing a superconducting article is described below with reference to the drawings.

Figure 1:
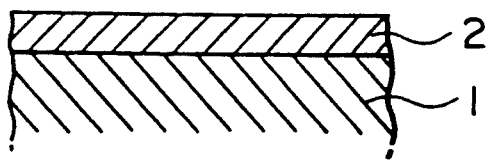
FIG. 1 is a cross-sectional view illustrating the former half steps in the method of the prior art for manufacturing a superconducting article.
Figure 2:
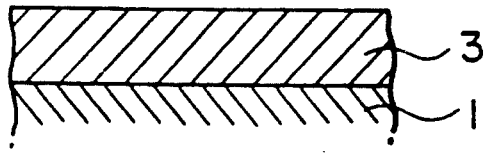
FIG. 2 is a cross-sectional view illustrating the latter half steps in the method of the prior art for manufacturing a superconducting article.
Figure 3:
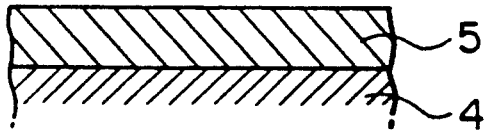
FIG. 3 is a cross-sectional view illustrating the former half steps in an embodiment of the method of the present invention for manufacturing a superconducting article.
Figure 4:
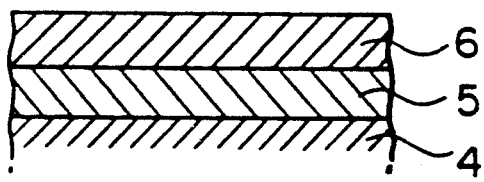
FIG. 4 is a cross-sectional view illustrating the middle half steps in the embodiment of the method of the present invention for manufacturing a superconducting article.
Figure 5:
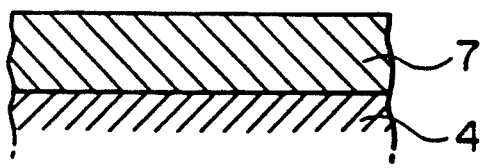
FIG. 5 is a cross-sectional view illustrating the latter half steps in the embodiment of the method of the present invention for manufacturing a superconducting article.

FIG. 3 is a schematic descriptive view illustrating the former half steps in an embodiment of the method of the present invention for manufacturing a superconducting article; FIG. 4 is a schematic descriptive view illustrating the middle half steps in the embodiment of the method of the present invention for manufacturing a superconducting article; and FIG. 5 is a schematic descriptive view illustrating the latter half steps in the embodiment of the method of the present invention for manufacturing a superconducting article.

In the method of the present invention for manufacturing a superconducting article, a first layer 5 comprising a mixture of $LnBa_2Cu_3O_x$ and $Ln_2BaCuO_{x'}$ is first formed by means of the known plasma metallizing method or the like on the surface of a substrate 4 as shown in FIG. 3. The substrate 4 comprises any one of ceramics, nickel and nickel-based alloy, which hardly reacts with a superconducting substance comprising $LnBa_2Cu_3O_x$. The content ratio of $Ln_2BaCuO_{x'}$ in the first layer 5 should be within the range of from 5 to 80 wt. % relative to the total amount of $LnBa_2Cu_3O_x$ and $Ln_2BaCuO_{x'}$.

The content ratio of $Ln_2BaCuO_{x'}$ in the first layer 5 is limited within the above-mentioned range for the following reason: With a content ratio of $Ln_2BaCuO_{x'}$ of under 5 wt. %, the amount of $Ln_2BaCuO_{x'}$ in the first layer 5 is insufficient relative to the amount of a mixture in a second layer described later, so that the non-reacting fraction of the mixture in the second layer remains in a film described later of the superconducting substance comprising $LnBa_2Cu_3O_x$, which film is to be formed on the surface of the substrate 4, thus causing deterioration of superconducting properties of the film of the superconducting substance. With a content ratio of $Ln_2BaCuO_{x'}$ of over 80 wt. %, on the other hand, the excessive amount of $Ln_2BaCuO_{x'}$ makes it impossible to prevent cracks from occurring in the film of the superconducting substance comprising $LnBa_2Cu_3O_x$, which cracks are caused by the expansion in volume of the film during formation of the film.

Then, as shown in FIG. 4, a second layer 6 having a melting point within the range of from 800° to 1,000° C. is formed by means of the known plasma metallizing method on the surface of the first layer 5. The second layer 6 comprises a mixture of at least CuO and $BaCuO_2$. A typical second layer 6 comprises a mixture of CuO, $BaCuO_2$ and BaO. In this case, the ratio of copper (Cu) to barium (Ba) in the second layer 6 should be within the range of Cu:Ba = 1:0.10 to 0.95 in molar ratio. Another example of the second layer 6 comprises a mixture of CuO, $BaCuO_2$, BaO, $Y_2O_3$ and $YBa_2Cu_3O_7$. In this case, the ratio of copper (Cu) to barium (Ba) and yttrium (Y) in the second layer 6 should be within the range of Cu:Ba:Y = 1:0.10 to 0.95:0.001 to 0.330 in molar ratio. Any of these mixtures in the second layer 6 diffusion-reacts with $Ln_2BaCuO_{x'}$ in the first layer 5, and, as a result, the first layer 5 and the second layer 6 are converted into a film of a superconducting substance comprising $LnBa_2Cu_3O_x$, as described below.

Then, the second layer 6 is melted, and the molten state of the second layer 6 is kept for a period of time of from 1 minute to 4 hours in an oxygen-containing atmosphere to cause the resultant melt of the mixture comprising at least CuO and $BaCuO_2$ in the second layer 6 to diffusion-react with $Ln_2BaCuO_{x'}$ in the first layer 5, thereby converting the first layer 5 and the second layer 6 into a film 7 of a superconducting substance comprising $LnBa_2Cu_3O_x$, as shown in FIG. 5.

The period of time of keeping the molten state of the second layer 6 is limited within the range of from 1 minute to 4 hours for the following reason: With a period of time of molten state of the second layer 6 of under 1 minute, the resultant melt of the mixture in the second layer 6 cannot be caused to sufficiently diffusion-react with $Ln_2BaCuO_{x'}$ in the first layer 5. With a period of time of molten state of the second layer 6 of over 4 hours, on the other hand, conversion of the first layer 5 and the second layer 6 into the film 7 of the superconducting substance comprising $LnBa_2Cu_3O_x$ does not proceed further.

The thus produced film 7 of the superconducting substance is then cooled to a room temperature, thereby manufacturing a superconducting article comprising, as shown in FIG. 5, the substrate 4 and the film 7 of the superconducting substance formed on the surface of the substrate 4.

According to the method of the present invention for manufacturing a superconducting article, as described above, the first layer 5 previously contains $LnBa_2Cu_3O_x$ in a prescribed amount, and this reduces the amount of $LnBa_2Cu_3O_x$ produced through the diffusion-reaction of the melt of the mixture in the second layer 6 with $Ln_2BaCuO_{x'}$ in the first layer 5. As a result, the amount of expansion in volume of the film 7 of the superconducting substance comprising $LnBa_2Cu_3O_x$ is reduced, thus preventing cracks from occurring in the film 7 of the superconducting substance.

Now, the method of the present invention for manufacturing a superconducting article is described in more detail by means of examples with reference to FIGS. 3 to 5.

EXAMPLE 1

A mixture of CuO, $BaCO_3$ and $Y_2O_3$, in which the ratio of copper (Cu) to barium (Ba) and yttrium (Y) was Cu:Ba:Y = 2:1.5:1.5 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 10 hours, cooled and pulverized into a powder to prepare a powdery material for first layer, having an average particle size within the range of from 26 to 44 $\mu$m. The thus prepared powdery material for the first layer comprised a mixture of $YBa_2Cu_3O_x$ and $Y_2BaCuO_{x'}$ and the content ratio of $Y_2BaCuO_{x'}$ in the powdery material for first layer was 50 wt. % relative to the total amount of $YBa_2Cu_3O_x$ and $Y_2BaCuO_{x'}$.

On the other hand, a mixture of CuO and $BaCO_3$, in which the ratio of copper (Cu) to barium (Ba) was Cu:Ba = 2:1 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 30 minutes, cooled and pulverized into a powder to prepare a powdery material for second layer, having an average particle size within the range of from 26 to 44 $\mu$m. The thus prepared powdery material for second layer comprised a mixture of CuO, $BaCuO_2$ and BaO.

Then, the powdery material for first layer prepared as described above was blown by means of the known plasma metallizing method onto the surface of a substrate 4 having a surface area of 1 $cm^2$ and a thickness of 1 mm and comprising a nickel-based alloy, to form a first layer 5 having a thickness of 50 $\mu$m on the surface of the substrate 4, as shown in FIG. 3.

Then, the powdery material for second layer prepared as described above was blown by means of the known plasma metallizing method onto the surface of the first layer 5, to form a second layer 6 having a thickness of 50 $\mu$m on the surface of the first layer 5, as shown in FIG. 4.

Then, the substrate 4, on the surface of which the first layer 5 and the second layer 6 were thus formed, was heated to a temperature of 950° C. in an electric furnace having an interior atmosphere of air to melt the second layer 6, and the molten state of the second layer 6 was kept for 30 minutes. This permitted the diffusion reaction of the resultant melt of the mixture of CuO, $BaCuO_2$ and BaO in the second layer 6 with $Y_2BaCuO_{x'}$ in the first layer 5, whereby the first layer 5 and the second layer 6 were converted into a film 7 of a superconducting substance comprising $YBa_2Cu_3O_x$ having a thickness of 70 $\mu$m, as shown in FIG. 5.

The substrate 4, on the surface of which the film 7 of the superconducting substance was thus produced, was slowly cooled in the electric furnace to a room temperature.

Thus, a superconducting article was manufactured, which comprised the substrate 4 comprising a nickel-based alloy and the film 7 of the superconducting substance comprising $YBa_2Cu_3O_x$ formed on the surface of the substrate 4, as shown in FIG. 5.

Investigation of the thus manufactured superconducting article revealed that the structure of the film 7 was dense with a single superconducting phase, and the superconducting article had a "Jc" of 1,000 $A/cm^2$.

EXAMPLE 2

A mixture of $CuO$, $BaCO_3$ and $Y_2O_3$, in which the ratio of copper (Cu) to barium (Ba) and yttrium (Y) was Cu:Ba:Y=2.4:1.7:1.3 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 10 hours, cooled and pulverized into a powder to prepare a powdery material for first layer, having an average particle size within the range of from 26 to 44 $\mu$m. The thus prepared powdery material for first layer comprised a mixture of $YBa_2Cu_3O_x$ and $Y_2BaCuO_{x'}$ and the content ratio of $Y_2BaCuO_{x'}$ in the powdery material for first layer was 30 wt. % relative to the total amount of $YBa_2Cu_3O_x$ and $Y_2BaCuO_{x'}$.

On the other hand, a mixture of $CuO$, $BaCO_3$ and $Y_2O_3$, in which the ratio of copper (Cu) to barium (Ba) and yttrium (Y) was Cu:Ba:Y=26:13:1 in molar ratio, was primary-fired at a temperature of 900° C. for 10 hours, cooled and pulverized into a powder. The powder of the thus primary-fired mixture was then secondary-fired at a temperature of 920° C. for 10 hours, cooled and pulverized into a powder. The powder of the thus secondary-fired mixture was then tertiary-fired at a temperature of 950° C. for 30 minutes, cooled and pulverized into a powder to prepare a powdery material for second layer, having an average particle size within the range of from 26 to 44 $\mu$m. The thus prepared powdery material for second layer comprised a mixture of $CuO$, $BaCuO_2$, $BaO$, $Y_2O_3$ and $YBa_2Cu_3O_7$.

Then, the powdery material for first layer prepared as described above was blown by means of the known plasma metallizing method onto the surface of a substrate 4 having a surface area of 1 cm² and a thickness of 1 mm and comprising a nickel-based alloy, to form a first layer 5 having a thickness of 50 $\mu$m on the surface of the substrate 4, as shown in FIG. 3.

Then, the powdery material for second layer prepared as described above was blown by means of the known plasma metallizing method onto the surface of the first layer 5, to form a second layer 6 having a thickness of 50 $\mu$m on the surface of the first layer 5, as shown in FIG. 4.

Then, the substrate 4, on the surface of which the first layer 5 and the second layer 6 were thus formed, was heated to a temperature of 950° C. in an electric furnace having an interior atmosphere of air to melt the second layer 6, and the molten state of the second layer 6 was kept for 30 minutes. This permitted the diffusion reaction of the resultant melt of the mixture of $CuO$, $BaCuO_2$, $BaO$, $Y_2O_3$ and $YBa_2Cu_3O_7$ in the second layer 6 with $Y_2BaCuO_{x'}$ in the first layer 5, whereby the first layer 5 and the second layer 6 were converted into a film 7 of a superconducting substance comprising $YBa_2Cu_3O_x$ having a thickness of 70 $\mu$m, as shown in FIG. 5.

Then, the substrate 4, on the surface of which the film 7 of the superconducting substance was thus produced, was slowly cooled in the electric furnace to a room temperature.

Thus, a superconducting article was manufactured, which comprised the substrate 4 comprising a nickel-based alloy and the film 7 of the superconducting substance comprising $YBa_2Cu_3O_x$ formed on the surface of the substrate 4, as shown in FIG. 5.

Investigation of the thus manufactured superconducting article revealed that the structure of the film 7 was dense with a single superconducting phase, and the superconducting article had a "Jc" of 1,100 A/cm².

According to the method of the present invention, as described above in detail, it is possible to manufacture a superconducting article having excellent superconducting properties, in which cracks are prevented from occurring in a film of a superconducting substance comprising $LnBa_2Cu_3O_x$, when the film of the superconducting substance is produced on the surface of a substrate through the diffusion-reaction, thus providing industrially useful effects.

What is claimed is:

1. A method for manufacturing a superconducting article, comprising the steps of:
    forming a first layer comprising a mixture of a superconductor $LnBa_2Cu_3O_x$ and a $Ln_2BaCu$ oxide on a surface of a substrate selected from the group consisting of ceramics, nickel and a nickel alloy, said Ln is a rare earth element, said mixture of the superconductor $LnBa_2Cu_3O_x$ and the $Ln_2BaCu$ oxide being prepared by subjecting a mixture of $CuO$, $BaCO_3$ and $Ln_2O_3$ to a plurality of treatments, each comprising a firing, a cooling and a pulverizing, and the content ratio of the $Ln_2BaCu$ oxide in said first layer being within the range of from 5 to 80 wt. % relative to the total amount of the superconductor $LnBa_2Cu_3O_x$ and the $Ln_2BaCu$ oxide; then
    forming a second layer comprising a mixture of at least $CuO$ and $BaCuO_2$ on a surface of said first layer, the molar ratio of copper to barium in said second layer being within the range of copper:barium=1:0.10 to 0.95, and said second layer having a melting point of from 800° to 1,000° C.; then
    melting said mixture in said second layer, and keeping the molten state of said second layer for a period of time of from 1 minute to 4 hours in an oxygen-containing atmosphere to cause the resultant melt of said mixture in said second layer to diffusion-react with the $Ln_2BaCu$ oxide in said first layer, thereby converting said first layer and said second layer into a film of an oxide superconductor comprising the superconductor $LnBa_2Cu_3O_x$; and
    cooling said film of said oxide superconductor thus produced to room temperature, thereby manufacturing said superconducting article comprising said substrate and said film of said oxide superconductor formed on the surface of said substrate.

2. The method as claimed in claim 1, wherein:
    said second layer comprises a mixture of $CuO$, $BaCuO_2$ and $BaO$.

3. The method as claimed in claim 1, wherein:
    said second layer comprises a mixture of $CuO$, $BaCuO_2$, $BaO$, $Y_2O_3$ and $YBa_2Cu_3O_7$; and
    the ratio of copper (Cu) to barium (Ba) and yttrium (Y) in said second layer is within the range of Cu:Ba:Y=1:0.10 to 0.95:0.001 to 0.330 in molar ratio.

4. The method of claim 1, wherein the first layer comprises a mixture of a superconductor $YBa_2Cu_3O_x$ and a $Y_2BaCu$ oxide with a content of the $Y_2BaCu$ oxide of 50 wt. % relative to the total amount of the superconductor $YBa_2Cu_3O_x$ and the $Y_2BaCu$ oxide, the second layer comprises a mixture of $CuO$, $BaCuO_2$ and $BaO$, with a molar ratio of copper to barium of 2:1 and the substrate comprises a nickel alloy.

5. The method of claim 1, wherein the first layer comprises a mixture of a superconductor $YBa_2Cu_3O_x$ and a $Y_2BaCu$ oxide with a content of the $Y_2BaCu$ oxide of 30 wt. % relative to the total amount of the superconductor $YBa_2Cu_3O_x$ and the $Y_2BaCu$ oxide, the second layer comprises a mixture of $CuO$, $BaCuO_2$, $BaO$, $Y_2O_3$ and $YBa_2Cu_3O_7$, with a molar ratio of copper to barium to yttrium of 26:13:1 and the substrate comprises a nickel alloy.

6. The method of claim 1, wherein the first layer is formed by a plasma metallizing method on the substrate.

7. The method of claim 6, wherein the second layer is formed by a plasma metallizing method on the first layer.

8. The method of claim 1, wherein Ln is Y.

9. The method of claim 8, wherein the substrate is a ceramic.

10. The method of claim 8, wherein the substrate is nickel.

11. The method of claim 8, wherein the substrate is a nickel alloy.

* * * * *